United States Patent
Jeong et al.

(10) Patent No.: US 8,510,684 B2
(45) Date of Patent: Aug. 13, 2013

(54) METHOD OF FORMING A PHOTOMASK LAYOUT USING OPTICAL PROXIMITY CORRECTION TO COMPENSATE FOR A THREE-DIMENSIONAL MASK EFFECT

(75) Inventors: Moon-Gyu Jeong, Gwangmyeong-si (KR); Seong-Woon Choi, Suwon-si (KR); Jung Hoon Ser, Seoul (KR)

(73) Assignee: Samsung Electronics Co., Ltd., Suwon-Si, Gyeonggi-Do (KR)

(*) Notice: Subject to any disclaimer, the term of this patent is extended or adjusted under 35 U.S.C. 154(b) by 0 days.

(21) Appl. No.: 13/327,379

(22) Filed: Dec. 15, 2011

(65) Prior Publication Data
US 2012/0221982 A1    Aug. 30, 2012

(30) Foreign Application Priority Data
Feb. 28, 2011 (KR) .................. 10-2011-0018013

(51) Int. Cl.
*G06F 17/50* (2006.01)
*G06F 7/60* (2006.01)

(52) U.S. Cl.
USPC ............... 716/53; 716/54; 716/55; 703/2

(58) Field of Classification Search
None
See application file for complete search history.

(56) References Cited

U.S. PATENT DOCUMENTS

| | | | |
|---|---|---|---|
| 6,830,854 B2* | 12/2004 | Liu et al. | 430/5 |
| 6,985,847 B2* | 1/2006 | Burdorf et al. | 703/22 |
| 7,393,615 B2* | 7/2008 | Ki et al. | 430/5 |
| 7,940,373 B2* | 5/2011 | Suh et al. | 355/55 |
| 8,078,995 B2* | 12/2011 | Tirapu Azpiroz et al. | 716/53 |
| 2004/0076895 A1* | 4/2004 | Liu et al. | 430/5 |
| 2005/0185159 A1 | 8/2005 | Rosenbluth et al. | |
| 2009/0013303 A1 | 1/2009 | Hwang et al. | |
| 2011/0224945 A1* | 9/2011 | Shim et al. | 702/150 |
| 2011/0265048 A1* | 10/2011 | Kim et al. | 716/53 |

FOREIGN PATENT DOCUMENTS

| | | |
|---|---|---|
| JP | 2005-234571 | 9/2005 |
| KR | 10-0688783 | 7/2006 |
| KR | 10-0891336 | 3/2009 |
| KR | 10-2009-0109349 | 10/2009 |

OTHER PUBLICATIONS

English Abstract for Publication No. 2005-234571.
English Abstract for Publication No. 10-2006-0075099 (FOR 10-0688783).
English Abstract for Publication No. 10-2009-0003941 (FOR 10-0891336).
English Abstract for Publication No. 10-2009-0109349.

* cited by examiner

*Primary Examiner* — A. M. Thompson
(74) *Attorney, Agent, or Firm* — F. Chau & Associates, LLC

(57) ABSTRACT

A method of forming a layout of a photomask includes receiving a layout of a mask pattern, obtaining image parameters of a two-dimensional (2D) layout mask from a simulation, obtaining image parameters of a three-dimensional (3D) layout mask from a simulation, and obtaining differences between the image parameters of the 2D and 3D masks. The differences between the image parameters of the 2D and 3D masks can be compensated by convolving a probability function with respect to an open area, represented by a visible kernel function, with a mask function to produce a first function, convolving a probability function with respect to a blocked area, represented by a visible kernel function, with the mask function to produce a second function, and summing the first function and the second function to produce a compensated vector. The layout of the mask pattern can be corrected using the compensated vector.

18 Claims, 14 Drawing Sheets

(a) (b) (c)

(a) (b) (c)

(a) Elliptic Ratio = 0

(b) Elliptic Ratio = 0.25

(c) Elliptic Ratio = 0.5

(d) Elliptic Ratio = 0.75

(e) Elliptic Ratio = 1

(f) Elliptic Ratio = 1.5

(g) Elliptic Ratio = 2

(h) Elliptic Ratio = 3

METHOD OF FORMING A PHOTOMASK LAYOUT USING OPTICAL PROXIMITY CORRECTION TO COMPENSATE FOR A THREE-DIMENSIONAL MASK EFFECT

CROSS-REFERENCE TO RELATED APPLICATIONS

This application claims benefit from Korean Patent Application No. 10-2011-0018013, filed on Feb. 28, 2011, in the Korean Intellectual Property Office, the contents of which are herein incorporated by reference in their entirety.

BACKGROUND

Embodiments of the inventive concept are directed to a method of forming a layout of a photomask, and more particularly, to a method of forming a layout of a photomask using optical proximity correction (OPC) to compensate for a three-dimensional (3D) effect of the photomask (hereinafter, referred to as a "3D mask effect").

The development of photolithography technology has accelerated the scaling down of integrated circuits. Accordingly, the size of a pattern transferred onto a wafer may be smaller than the wavelength of an exposure beam. Thus, optical proximity correction (OPC) to compensate for light diffraction and interference has become an important process for fine and reliable micro-patterning. However, when using OPC, it may be necessary to compensate for a 3D mask effect.

SUMMARY

Embodiments of the inventive concept provide a method of forming a photomask layout using optical proximity correction (OPC) to compensate for a three-dimensional (3D) mask effect.

According to an aspect of the inventive concept, there is provided a method of forming a layout of a photomask, the method comprising: receiving a layout of a mask pattern; obtaining one or more image parameters of a two-dimensional (2D) mask for the layout from a simulation; obtaining one or more image parameters of a three-dimensional (3D) mask for the layout from a simulation; obtaining differences between the image parameters of the 2D and 3D masks; and performing optical proximity correction (OPC) on the 2D mask to compensate for the differences between the image parameters of the 2D and 3D masks by using a visible kernel with respect to the 2D mask.

Compensating for the difference between the image parameters may include: selecting a target point on an edge of the layout; setting a proximity range from the target point; defining a probability function including one or more of a distance-dependent component and an orientation-dependent component with respect to the proximity range; and calculating a surface integral of the probability function over the proximity range, where the surface integral is used to model OPC associated with positions of visible features in said layout with respect to the target point.

The distance-dependent component may decrease with increasing distance from the target point. The distance-dependent component may be proportional to a reciprocal of the distance, as expressed by $$f(r) = \frac{a}{r},$$

wherein $f$ is the distance-dependent component, $r$ is the distance, and $a$ is a constant.

The distance-dependent component may include a Gaussian function with respect to the distance, expressed as $$G(r) = ae^{-\left(\frac{r}{b}\right)^2},$$

where $G(r)$ is the Gaussian function, $r$ is the distance, and $a$ and $b$ are constants.

The orientation-dependent component may vary depending on an azimuth from a reference line passing through the target point. The reference line may extend in a direction perpendicular to the edge. The orientation-dependent component may be symmetric with respect to the reference line. The orientation-dependent component may decrease as the azimuth increases. The orientation-dependent component may further be a function of an elliptic ratio.

The orientation-dependent component may be proportional to a cosine of the azimuth. The cosine of the azimuth may also be a function of an elliptic ratio, expressed as $f(\theta) = a\cos(Er \times \theta)$, where $f$ is the orientation-dependent component, $Er$ is the elliptic ratio, $\theta$ is the azimuth, and $a$ is a constant.

The orientation-dependent component may be a Gaussian function with respect to the azimuth, the Gaussian function being expressed as $$G(\theta) = ae^{-\left(\frac{\theta}{b}\right)^2},$$

where $G(\theta)$ is the Gaussian function, $\theta$ is the azimuth, and $a$ and $b$ are constants.

The orientation-dependent component Gaussian function may also be a function of an elliptical ratio, the Gaussian function being expressed as $$G(\theta) = ae^{-\left(\frac{Er \times \theta}{b}\right)^2},$$

where $G(\theta)$ is the Gaussian function, $Er$ is the elliptic ratio, $\theta$ is the azimuth, and $a$ and $b$ are constants.

The proximity range may include an orientation-dependent component. The orientation-dependent component of the proximity range may vary according to an elliptic ratio.

Selecting the target point may include selecting a middle point of the edge as the target point.

According to another aspect of the inventive concept, there is provided a method of forming a layout of a photomask, the method including: designing a layout; performing optical proximity correction (OPC) on the layout, including: receiving the layout of the mask pattern; obtaining one or more image parameters of a 2D mask for the layout from a simulation; obtaining one or more image parameters of a 3D mask for the layout from a simulation; and compensating for a difference between the image parameters by using a visible kernel with respect to the 2D mask; and correcting the layout using OPC.

According to another aspect of the inventive concept, there is provided a method of forming a layout of a photomask, the method including: receiving a layout of a mask pattern; compensating for differences between image parameters of a 2D mask for the layout pattern and a 3D mask for the layout pattern by using a visible kernel with respect to the 2D mask, including: selecting a target point on an edge of the layout; setting a proximity range from the target point; defining a probability function including one or more of a distance-dependent component and an orientation-dependent component with respect to the proximity range; and calculating a surface integral of the probability function over the proximity range, wherein said surface integral is used to model optical proximity correction associated with positions of visible features in said layout with respect to the target point.

According to a further aspect of the inventive concept, the method may include obtaining one or more image parameters of the two-dimensional (2D) mask for the layout from a simulation; obtaining one or more image parameters of the three-dimensional (3D) mask for the layout from a simulation; and obtaining differences between the image parameters of the 2D and 3D masks.

The differences may be compensated by a compensated vector $\overrightarrow{Comp}$ obtained by convolving a probability function with respect to an open area, represented by a visible kernel function, $\Psi_{op}$, with a mask function M(x,y), convolving a probability function with respect to a blocked area, represented by a visible kernel function, $\Psi_{bl}$, with the mask function M(x,y) to produce a second function, and summing the first function and the second function, as expressed by $\overrightarrow{Comp} = C_{op} \cdot \Psi_{op}(x,y) \otimes M(x,y) + C_{bl} \cdot \Psi_{bl}(x,y) \otimes M(x,y) + C_0$, wherein $C_{op}$, $C_{bl}$, and $C_0$ are constants determined to minimize an error between the compensated vector $\overrightarrow{Comp}$ and the differences $\overrightarrow{diff}$ between the image parameters of the 2D and the image parameters of the 3D masks.

DETAILED DESCRIPTION OF EXEMPLARY EMBODIMENTS

Figure 1:
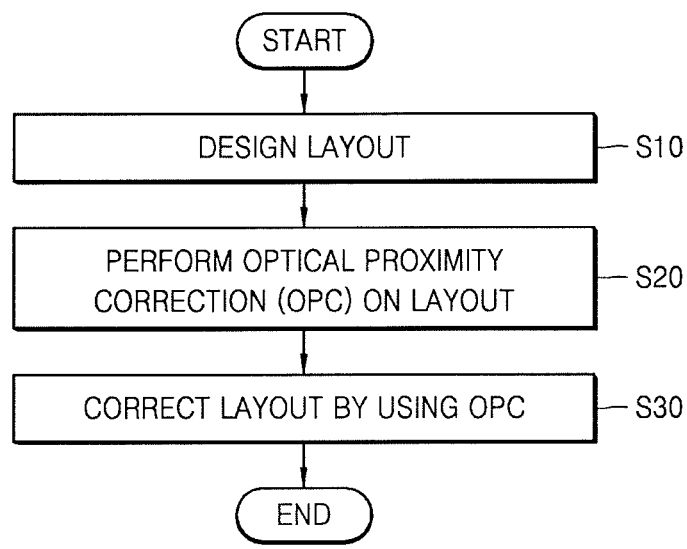
FIG. 1 is a flowchart illustrating a method of forming a layout of a photomask, according to an embodiment of the inventive concept.

Embodiments of the inventive concept will now be described more fully with reference to the accompanying drawings, in which exemplary embodiments of the inventive concept are shown.

The inventive concept may, however, be embodied in different forms and should not be construed as limited to the embodiments set forth herein. In the drawings, the thicknesses or sizes of layers may be exaggerated for clarity.

FIG. 1 is a flowchart illustrating a method of forming a layout of a photomask, according to an embodiment of the inventive concept.

In detail, the method includes operation S10 in which a layout of a mask pattern is designed, operation S20 in which optical proximity correction (OPC) is performed on the layout, and operation S30 in which the layout is corrected using OPC.

OPC for a photomask may be classified as either model-based OPC or rule-based OPC. Model-based OPC may be more easily applied to mask pattern layouts than rule-based OPC.

If model-based OPC is performed, an OPC model may be obtained by simulating a two-dimensional (2D) photomask that has a light-transmitting portion and a non-transmitting portion. However, a photomask is actually a three-dimensional (3D) photomask in which a mask pattern having a predetermined thickness is formed on a surface. Accordingly, if model-based OPC is performed, an OPC model should be obtained by performing a simulation that considers the 3D mask effect, in which the simulation accounts for positional relationships between mask patterns and the thickness of each of the mask patterns, as well as the light-transmitting portion and the non-transmitting portion.

Examples of a rigorous simulation of a 3D mask effect include a finite difference time domain (FDTD) simulation, a rigorous coupled wave analysis (RCWA), and a time-domain electromagnetic massively parallel evaluation of scattering from topography (TEMPEST), a type of FDTD simulation. However, these rigorous simulations are challenging and time consuming to use when performing OPC over a wide area. Accordingly, faster simulations for developing an OPC model and compensating for the 3D mask effect would be useful.

Furthermore, when a photomask is exposed, the 3D mask effect may occur due to internal scattering, mask induced polarization, etc. Also, decreasing the widths of mask patterns or spaces between mask patterns interferes with the ability of light, such as ArF laser light, to pass through a mask, thereby further increasing a 3D mask effect.

Figure 2A:
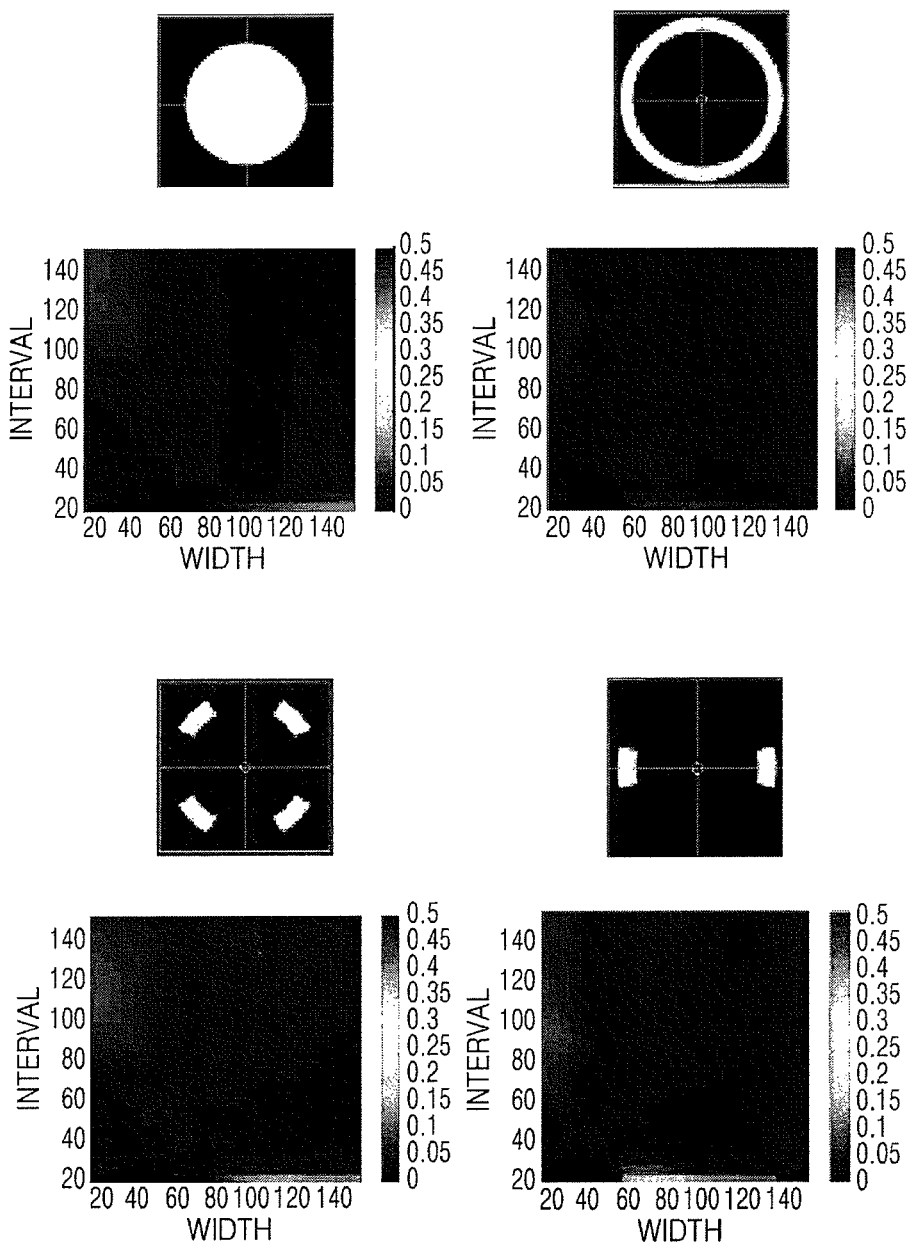
FIGS. 2A and 2B are diagrams obtained by simulating a difference in image contrast between a two-dimensional (2D) and a three-dimensional (3D) mask according to an embodiment of the inventive concept.
Figure 2B:
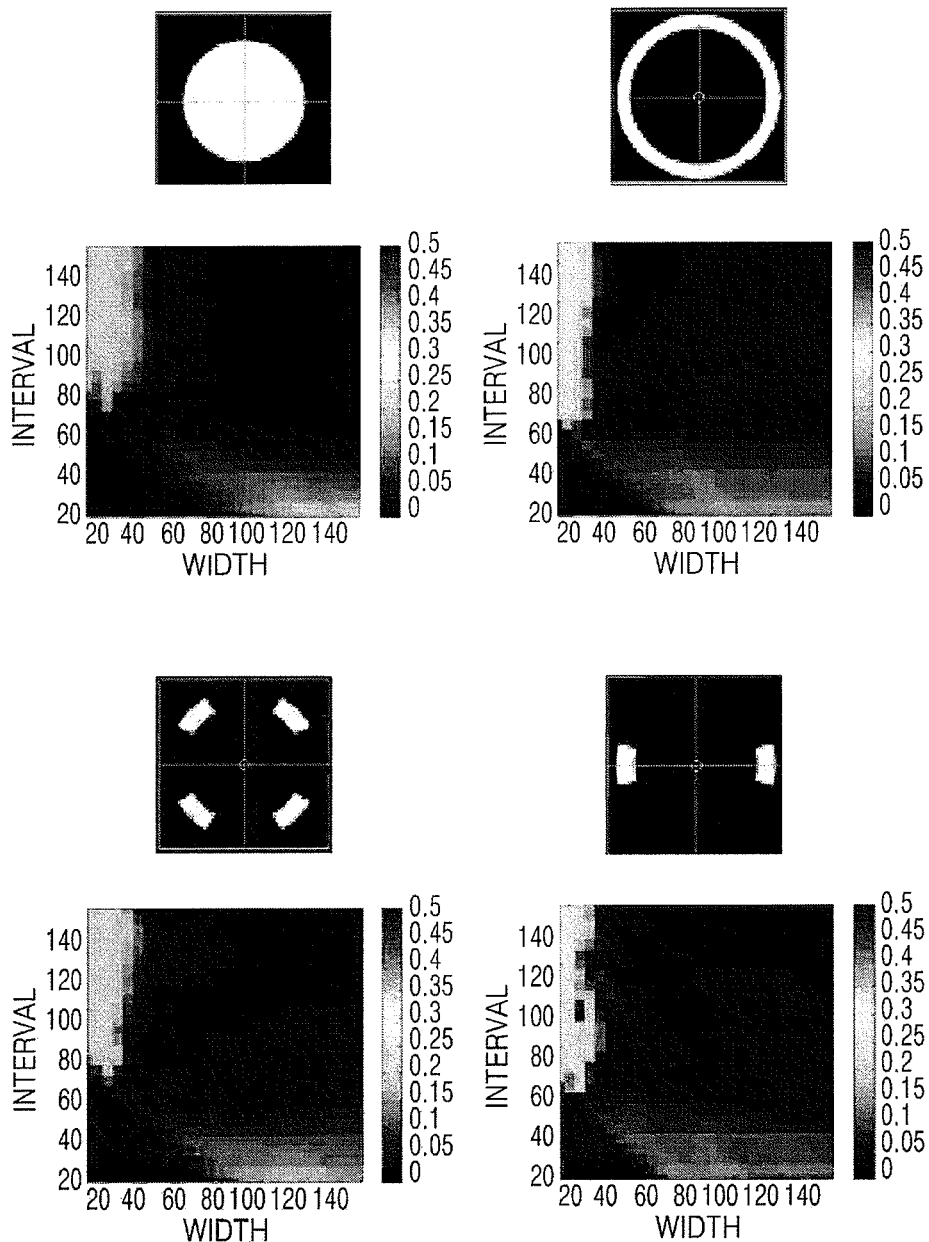

FIGS. 2A and 2B are diagrams obtained by simulating a difference in image contrast between a 2D mask and a 3D mask according to an embodiment of the inventive concept.

In detail, examples of an exposure device illumination system include a circular illumination system, an annular illumination system, a four-point illumination system, and a two-point illumination system. In FIGS. 2A and 2B, the upper figures illustrate the illumination systems, and the lower figures show the contrast differences. FIG. 2A shows a line and space pattern, and FIG. 2B shows a mask pattern. Irrespective of a shape of a pattern or an illumination system, the image contrast difference increases as a width or a space decreases as indicated by the light intensity scale on the right hand side. In other words, as indicated by light intensity, image contrast differences increases as a width or a space of a mask pattern decreases.

As such, if OPC is simulated for a 2D mask and a 3D mask, a 3D mask effect occurs as indicated by the image contrast difference. In other words, as a width or space of a mask pattern decreases, the 3D mask effect increases as shown in FIGS. 2A and 2B. Accordingly, to compensate for a 3D mask effect while modeling OPC, a simulation should account for the width of a mask pattern, the spaces between mask patterns, and the positions of the mask patterns.

Figure 3:
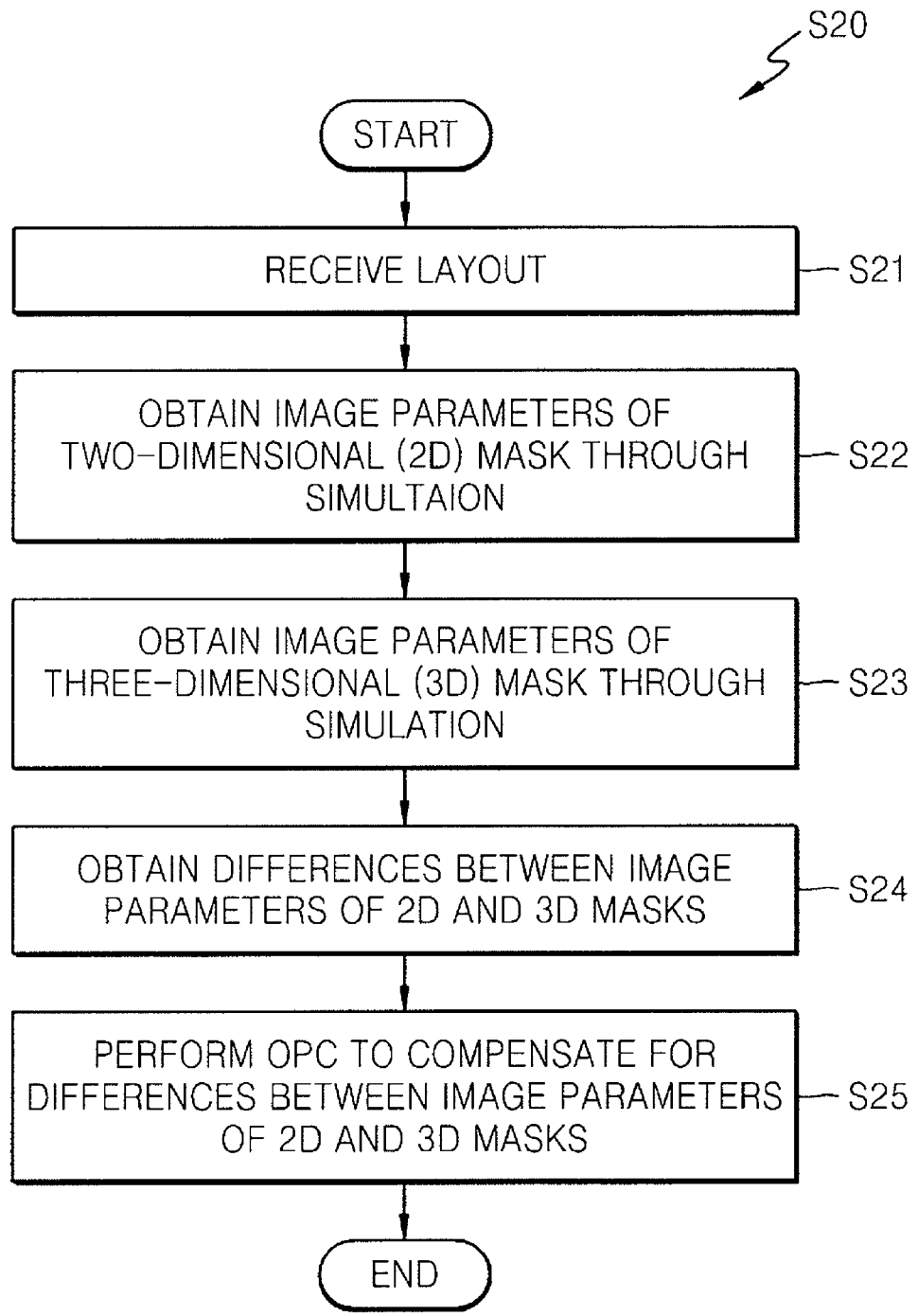
FIG. 3 is a flowchart illustrating a method of performing optical proximity correction (OPC) to compensate for a 3D mask effect, according to an embodiment of the inventive concept.

FIG. 3 is a flowchart illustrating a method of performing OPC to compensate for a 3D mask effect, according to an embodiment of the inventive concept.

In detail, FIG. 3 illustrates operation S20 in which OPC is performed to compensate for a 3D mask effect in the method of FIG. 1.

Operation S20 includes operation S21 in which a layout of a mask pattern is received from a simulation tool. Next, in operation S22, image parameters of a 2D image for the layout are obtained from a simulation. Next, in operation S23, image parameters of a 3D mask for the layout are obtained from a simulation. Here, the image parameters may include a threshold value of image light intensity for a mask pattern. The image parameters may include another parameters obtained from a simulation.

Next, in operation S24, differences between image parameters of the 2D mask and the 3D mask are obtained. Next, in operation S25, OPC is performed on the layout with a visible kernel to compensate for the differences between the image parameters of the 2D mask and the 3D mask.

Figure 4A:
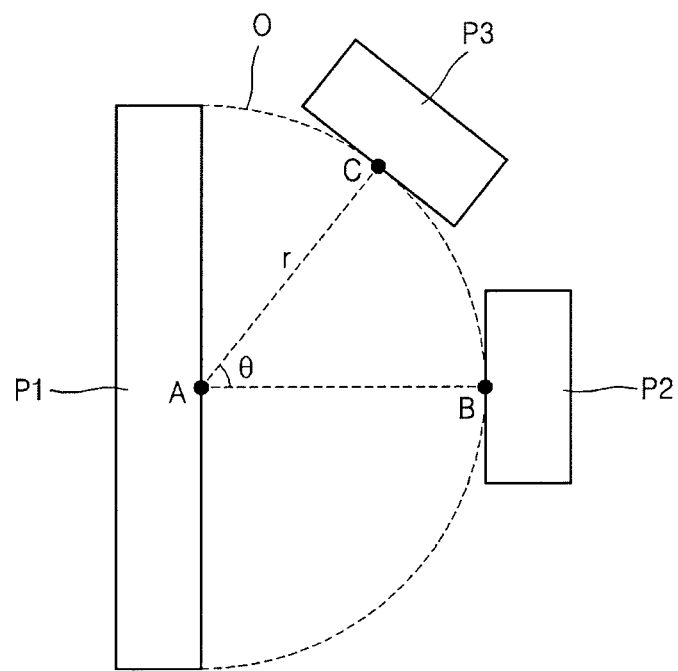
FIGS. 4A and 4B are views that illustrate a visible kernel according to an embodiment of the inventive concept.
Figure 4B:
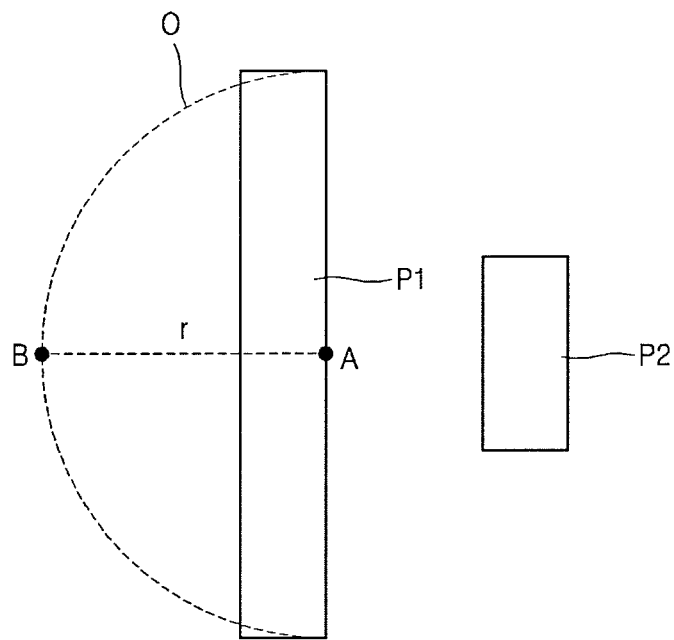

FIGS. 4A and 4B are views that illustrate a visible kernel according to an embodiment of the inventive concept.

In detail, a visible kernel used in a simulation will now be explained. In FIG. 4A, first through third features P1, P2, and P3 are shown. The first feature P1 is a reference feature, and the second feature P2 and the third feature P3 are spaced apart from the first feature P1 by the same distance r. That is, lengths of a segment "AC' and a segment "AB" are equal to each other. FIG. 4A illustrates an influence on an open area when viewed from the reference feature P1.

If an interaction between features depends on only a distance, influences of the second feature P2 and the third feature P3 on a point "A" on the first feature P1 may be the same. However, if an interaction between features depends on relative orientations of the features as well, an influence of the second feature P2 and an influence of the third feature P3 may differ from each other. For example, an influence of the second feature P2 that is located perpendicular to the point "A" (that is, located on the segment "AB" perpendicular to an edge including the point "A") may be greater than an influence of the third feature P3 that is inclined with respect to the point "A".

If a visible kernel of FIG. 4A is used, a proximity range is a semicircular region O defined by the distance from the target point A to the second feature P2 and to the third feature P3. The term 'proximity range" refers to an interaction range between features. Accordingly, information about a distance component or an orientation component of the second feature P2 or the third feature P3 in the proximity range of the first feature P1 may be obtained.

In FIG. 4B, first and second features P1 and P2 are shown. The first feature P1 is a reference feature, and the second feature P2 is spaced apart from the first feature P1. FIG. 4B illustrates an influence on a blocked area when viewed from the reference feature P1.

In FIG. 4B, a proximity range is a semicircular region O located on the opposite side of the second feature P2 with respect to the target point A. Accordingly, if a visible kernel of FIG. 4B is used, information about a width of the first feature P1 in the proximity range may be obtained.

In FIGS. 4A and 4B, the point "A" may be referred to as a target point, the segment "AB" may be referred to as a reference line, the semicircular region "O" may be referred to as a proximity range, and an angle CAB (that is, θ) may be referred to as an azimuth. Also, in FIG. 4A, the first feature P1, the second feature P2, and the third feature P3 form a layout, and in FIG. 4B, the first feature P1 and the second feature P2 form a layout.

Figure 5:
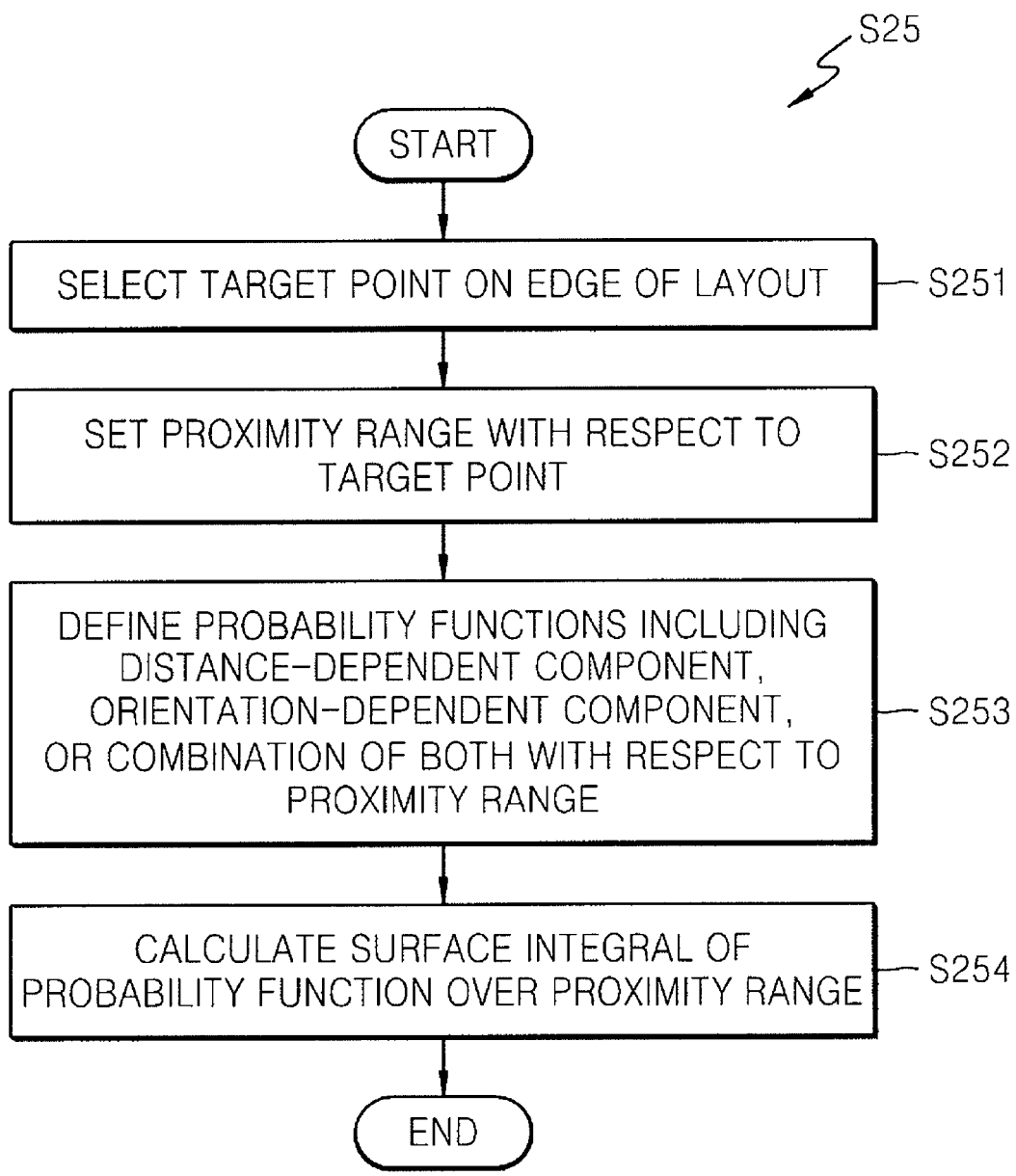
FIG. 5 is a flowchart illustrating a method of compensating for differences between image parameters by using a visible kernel, according to an embodiment of the inventive concept.

FIG. 5 is a flowchart illustrating a method of compensating for differences between image parameters using a visible kernel, according to an embodiment of the inventive concept.

In detail, FIG. 5 explains operation S25 in which differences between image parameters are compensated for by using a visible kernel in the method of FIG. 3.

Operation S25, in which differences between image parameters are compensated by using a visible kernel, includes operation S251 in which a target point is selected on an edge of a layout, operation S252 in which a proximity range with respect to the target point is set, operation S253 in which probability functions that include a distance-dependent component, an orientation-dependent component, or a combination of both, are defined with respect to the proximity range, and operation S254 in which a surface integral of the probability function is calculated over the proximity range. A probability function may also be referred to as a visible function, a weight function, or a statistical function.

Operation S25, in which differences between image parameters are compensated for in the method of FIG. 3, will now be explained with reference to FIGS. 4A and 4B. In operation S251, a first feature P1 is selected in a layout, and a point "A" is selected as a target point on an edge of the first feature P1. In this case, a middle point of the edge may be selected as the target point. However, this target point selection is exemplary and the present embodiment is not limited thereto. In operation S252, a semicircular region "O" from the target point "A" is selected to be a proximity range. Next, in operation S253, a probability function that includes either a distance-dependent component, an orientation-dependent component, or both, is defined with respect to the semicircular proximity range region "O". In operation S254, a surface integral of the probability function is calculated over the semicircular proximity range region "O". The surface integral of the probability function is used to model OPC associated with positions of visible features with respect to the target point.

A probability function will now be explained in detail. As described above, the probability function may include either a distance-dependent component, an orientation-dependent component, or both.

The orientation-dependent component may vary with an azimuth with respect to a reference line that passes through a target point. Here, the reference line may extend in a direction perpendicular to an edge. Since an azimuth may exist on both sides of the reference line, the orientation-dependent component may be symmetric with respect to the reference line. For example, the orientation-dependent component may decrease as the azimuth increases. For example, the orientation-dependent component may be proportional to a cosine of the azimuth, and may be defined as follows.

$$f_1 = a \cos \theta \qquad \text{[Equation 1]}$$

where $f_1$ is the orientation-dependent component, $\theta$ is the azimuth, and a is a constant.

Alternatively, the orientation-dependent component may further include an elliptic ratio. For example, the orientation-dependent component may be proportional to $\cos(Er \times \theta)$ where Er is the elliptic ratio and $\theta$ is the azimuth, and may be defined as follows.

$$f_1 = a \cos(Er \times \theta) \qquad \text{[Equation 2]}$$

where $f_1$ is the orientation-dependent component, Er is the elliptic ratio, $\theta$ is the azimuth, and a is a constant.

Alternatively, the orientation-dependent component may include a Gaussian function with respect to the azimuth. For example, the Gaussian function may be expressed as in Equation 3.

$$f_1 = G(\theta) = ae^{-\left(\frac{\theta}{b}\right)^2} \qquad \text{[Equation 3]}$$

where $G(\theta)$ is the Gaussian function, $f_1$ is the orientation-dependent component, $\theta$ is the azimuth, and a and b are constants.

Also, the orientation-dependent component may include an elliptic ratio, and for example, may include a Gaussian function with respect to the azimuth, the Gaussian function being expressed as in Equation 4.

$$f_1 = G(\theta) = ae^{-\left(\frac{Er \times \theta}{b}\right)^2} \qquad \text{[Equation 4]}$$

where $f_1$ is the orientation-dependent component, Er is the elliptic ratio, $\theta$ is the azimuth, a and b are constants, and $G(\theta)$ is the Gaussian function.

The distance-dependent component may vary with a distance from the target point. For example, the distance-dependent component may decrease as the distance, for example, a separation distance, increases. In addition, the distance-dependent component may be proportional to a reciprocal of the distance, and may be expressed as in Equation 5.

$$f_2 = \frac{a}{r} \qquad \text{[Equation 5]}$$

where $f_2$ is the distance-dependent component, r is the distance, and a is a constant.

Alternatively, the distance-dependent component may include a Gaussian function with respect to the distance. For example, the Gaussian function may be expressed as in Equation 6.

$$f_2 = G(r) = ae^{-\left(\frac{r}{b}\right)^2} \qquad \text{[Equation 6]}$$

where $G(r)$ is the Gaussian function, $f_2$ is the distance-dependent component, r is the distance, and a and b are constants.

As described above, the probability function may include a distance-dependent component, an orientation-dependent component, or both. If the probability function includes only an orientation-dependent component, the probability function may be expressed as in one of Equations 1 through 4 or a combination thereof. Alternatively, if the probability function includes only a distance-dependent component, the probability function may be expressed may be expressed as in Equation 5 or Equation 6, or a combination thereof. However, if the probability function includes both a distance-dependent component and an orientation-dependent component, the probability function may be expressed as a product of the orientation-dependent component and the distance-dependent component as expressed in Equation 7.

$$F(r, \theta) = f_1 \times f_2 \qquad \text{[Equation 7]}$$

where F is the probability function, $f_1$ is the orientation-dependent component, $f_2$ is the distance-dependent component, r is the distance, and $\theta$ is the azimuth.

In some embodiments of the inventive concept, the proximity range may include the orientation-dependent component. Also, the proximity range may vary according to the elliptic ratio, which will be explained in detail below with reference to FIGS. 15 and 16.

Figure 6:
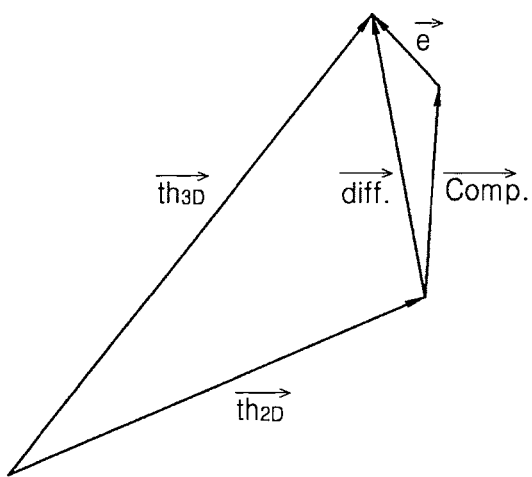
FIG. 6 is a conceptual view that illustrates OPC to compensate for a 3D mask effect, according to an embodiment of the inventive concept.

FIG. 6 is a conceptual view that illustrates OPC to compensate for a 3D mask effect, according to an embodiment of the inventive concept.

In detail, FIG. 6 is a view that illustrates a method of compensating for differences between image parameters when OPC that compensates for a 3D mask effect is performed in the methods of FIGS. 3 and 5.

As described in operation S22, an image parameter of a 2D layout mask is obtained from a simulation. As described in operation S23, an image parameter of a 3D layout mask is obtained from a simulation. As described above, an image parameter may be an image light intensity threshold value for a mask pattern. The image parameter may also be another parameter obtained from a simulation.

The image parameters of the 2D mask and the image parameters of the 3D mask may be expressed as vectors, the number of which corresponds to the number of samples used in a simulation model. Accordingly, the image parameters of the 2D mask and the image parameters of the 3D mask may be respectively expressed as a vector $\vec{th}_{2D}$ and a vector $\vec{th}_{3D}$.

As described in operation S24, a difference between the image parameters of the 2D and 3D masks is obtained. The difference between the image parameters of the 2D and 3D masks may be expressed as a vector $\vec{diff}$.

Next, as described in operation S25, the difference between the image parameters of the 2D and 3D masks is compensated for by using a visible kernel. The difference between the image parameters, that is, the vector cliff is compensated by a compensated vector $\vec{Comp}$. The compensated vector $\vec{Comp}$ is obtained by using a visible kernel as described above, which may be mathematically expressed as in Equation 8.

$$\vec{Comp} = C_{op} \cdot \Psi_{op}(x,y) \otimes M(x,y) + C_{bl} \cdot \Psi_{bl}(x,y) \otimes M(x,y) + C_0 \qquad \text{[Equation 8]}$$

As shown in Equation 8, the compensated vector $\vec{Comp}$ is obtained by convolving a probability function with respect to an open area, represented by a visible kernel function, $\Psi_{op}$, with a mask function M(x,y) to produce a first function, convolving a probability function with respect to a blocked area, represented by a visible kernel function, $\Psi_{bl}$, with the mask function M(x,y) to produce a second function, and summing the first function and the second function. There may be various types of probability functions as described above. In Equation 8, $C_{op}$, $C_{bl}$, and $C_0$ are constants.

The compensated vector $\overrightarrow{Comp}$ accounts for a vector $th_{2D}$ with respect to the image parameters of the 2D mask and is used while modeling OPC. In FIG. 6, $\vec{e}$ is an error vector. The constants $C_{op}$, $C_{bl}$, and $C_0$ are determined to minimize the error vector $\vec{e}$.

Figure 7:
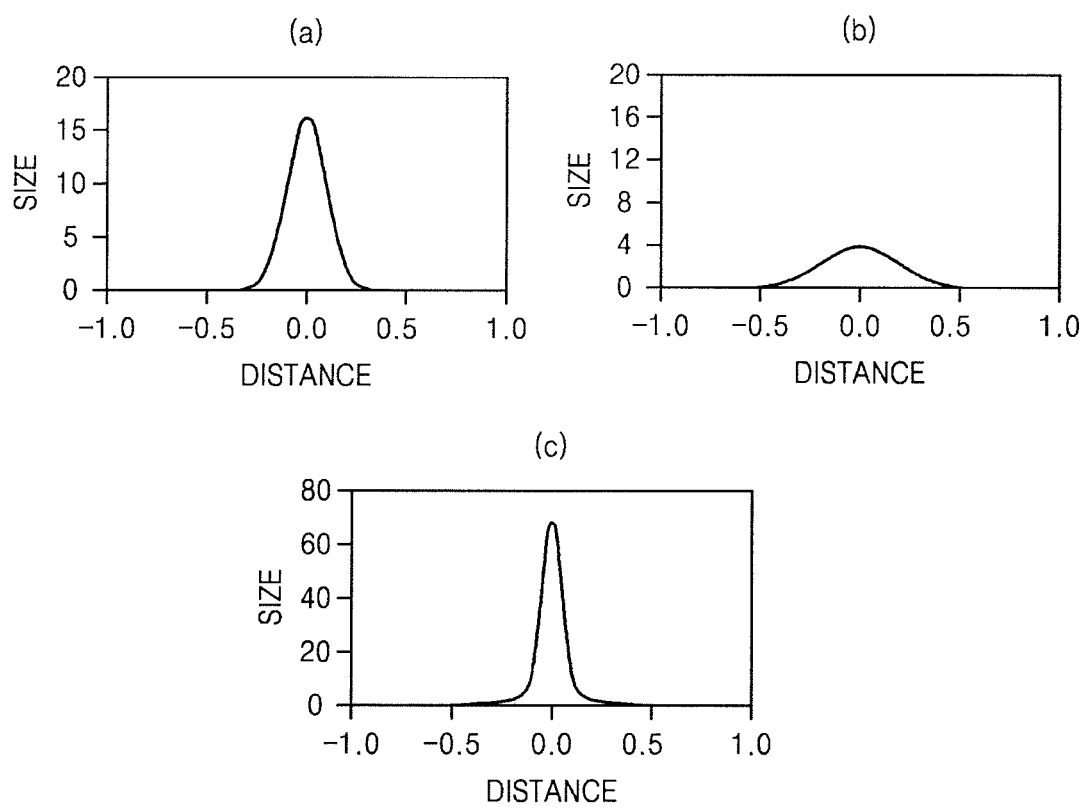
FIG. 7 presents three graphs illustrating probability functions used in a visible kernel, according to embodiments of the inventive concept.
Figure 8:
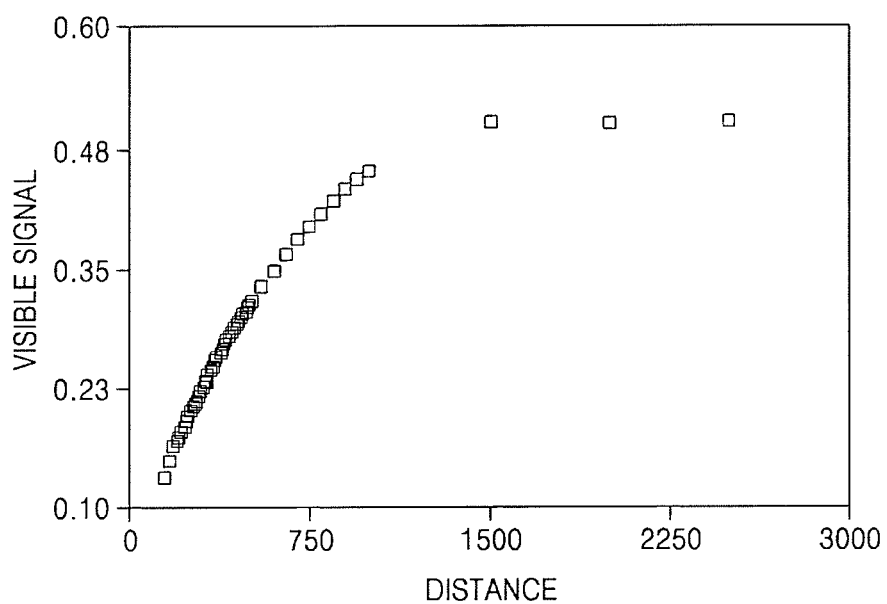
FIG. 8 is a graph illustrating distances of features which may be obtained from a visible kernel, according to an embodiment of the inventive concept.

FIG. 7 depicts three graphs illustrating probability functions used in a visible kernel, according to embodiments of the inventive concept. FIG. 8 is a graph illustrating distances of features which may be obtained from a visible kernel, according to an embodiment of the inventive concept.

In detail, the probability functions used in the visible kernel may be a narrow Gaussian function (a), a wide Gaussian function (b), or a double-height Gaussian function (c), as shown in FIG. 7. The probability functions used in the visible kernel may be functions other than Gaussian functions, such as Lorenz functions.

If modeling is performed with a simulation tool using such a function, a visible signal from which information about distances from or spaces between features may be obtained as shown in FIG. 8. The information about the distances or spaces between features may be used to compensate for a 3D mask effect in an OPC model during a simulation.

Figure 9:
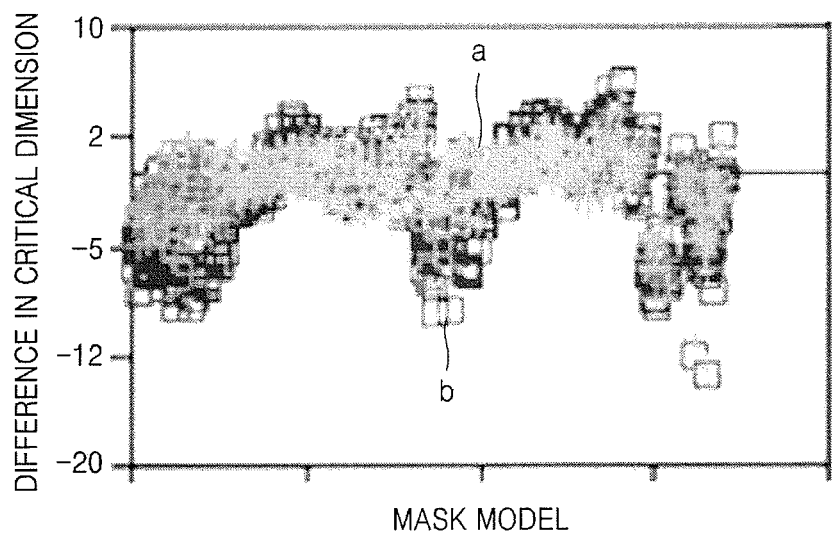
FIGS. 9 and 10 are graphs illustrating a difference in critical dimension between a 2D mask, a 3D mask, and a compensated 2D mask according to embodiments of the inventive concept.
Figure 10:
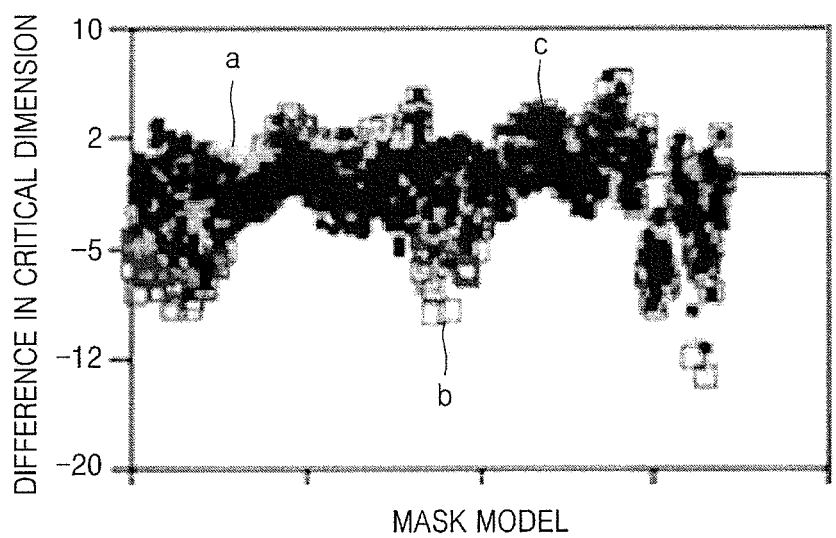

FIGS. 9 and 10 are graphs illustrating differences in a critical dimension (CD) between a 2D mask, a 3D mask, and a compensated 2D mask according to embodiments of the inventive concept.

In detail, FIG. 9 illustrates a difference b between a mask critical dimension and a 2D mask model critical dimension when simulating OPC with a 2D mask, and a difference a between a mask critical dimension and a 3D mask model critical dimension when simulating OPC with a 3D mask.

FIG. 10 illustrates a difference c between a mask critical dimension and a compensated 2D mask model critical dimension when simulating OPC with a compensated 2D mask. As described above, the compensated 2D mask is obtained by modeling after compensating for a difference between image parameters by using a visible kernel.

A root mean square (RMS) error of the difference between the mask critical dimension and the 3D mask model critical dimension is about 2.29, an RMS error of the difference between the mask critical dimension and the 2D mask model critical dimension is about 3.20, and an RMS error of the difference between the mask critical dimension and the compensated 2D mask model critical dimension is about 2.57.

Accordingly, an RMS error of a compensated 2D mask obtained by compensating for a 3D mask effect in the case of a 2D mask as described above with reference to FIG. 6 is lower than that of a simple 2D mask. In this case, the compensated 2D mask enables OPC to be easily performed because it compensates for a 3D mask effect with respect to the 2D mask.

FIGS. 11 through 14 are graphs illustrating distributions of probability functions according to embodiments of the inventive concept. In each of FIGS. 11 through 14, (a) shows a 3D probability plot, (b) shows a 2D plot of a portion of (a), and (c) shows an orientation-dependent weight.

Figure 11:
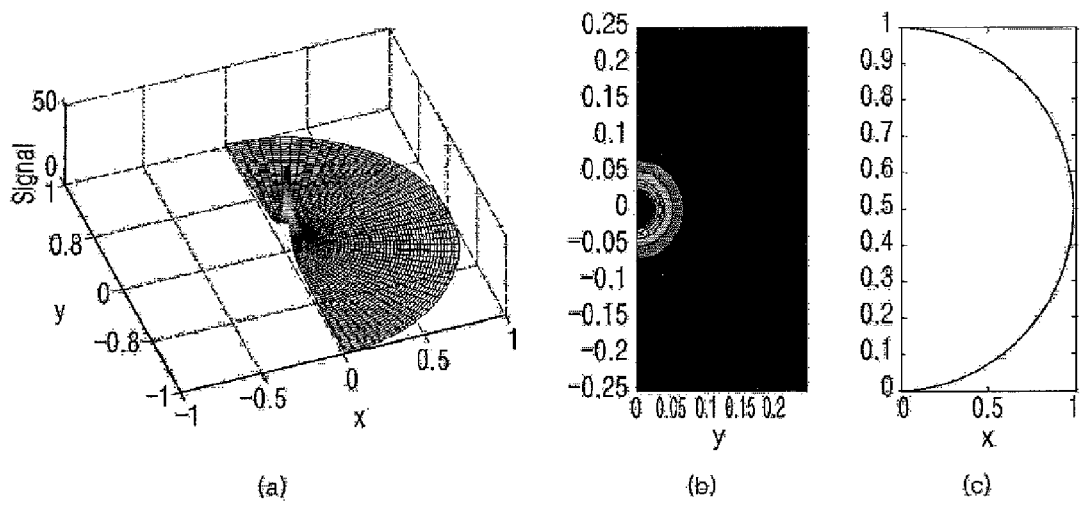
FIGS. 11 through 14 are graphs illustrating distributions of probability functions according to embodiments of the inventive concept.

Referring to FIG. 11, the probability function is given by Equation 5. That is, the probability function is proportional to a reciprocal of the distance, and constant with respect to the azimuth. Accordingly, the probability function has a higher value closer to a target point. As shown in (c), the orientation-dependent weight is uniform over all orientations.

Figure 12:
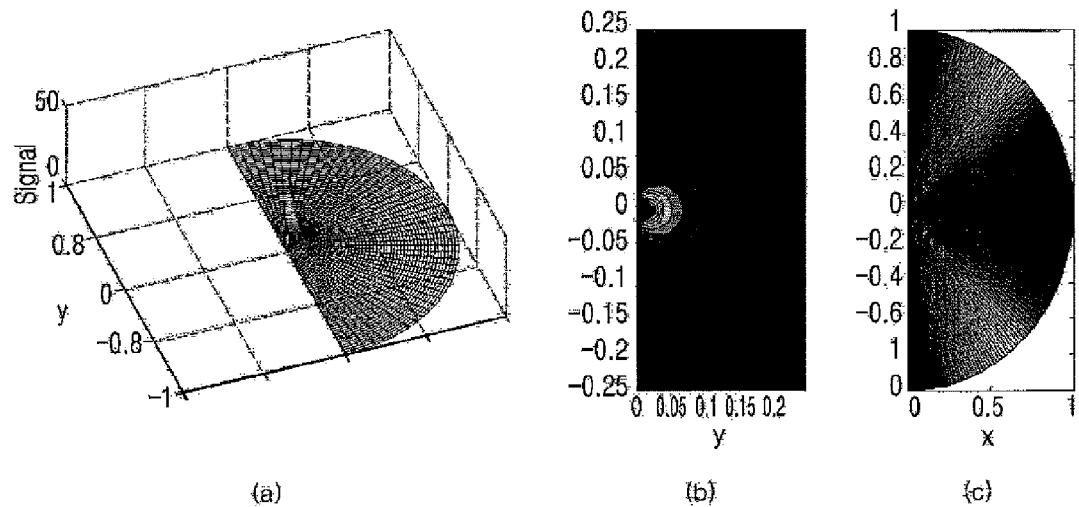

Referring to FIG. 12, the probability function is given by a combination of Equation 1 and Equation 5. That is, the probability is a function of both the distance and the azimuth, and is expressed as in Equation 9.

$$F(r, \theta) = \frac{a}{r}\cos\theta \qquad \text{[Equation 9]}$$

where F is the probability function, $\theta$ is the azimuth, r is the distance, and a is a constant.

The probability function produces a higher value closer to a target point, that is, as the distance r decreases. Also, the probability function produces a higher value as the azimuth approaches 0, that is, a reference line. Also, as shown in (c), the orientation-dependent weight increases as the azimuth approaches 0.

Figure 13:
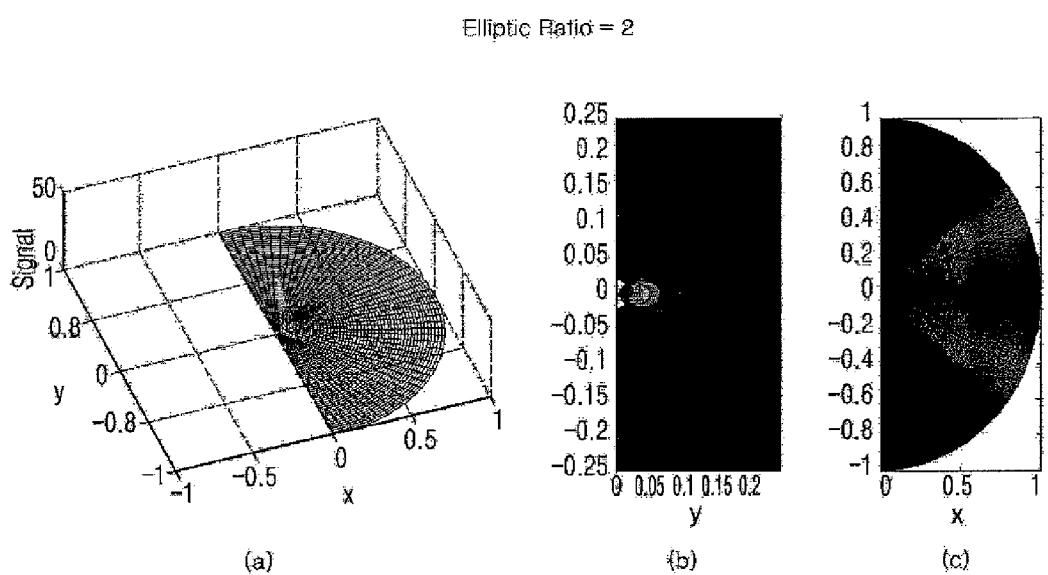
Figure 14:
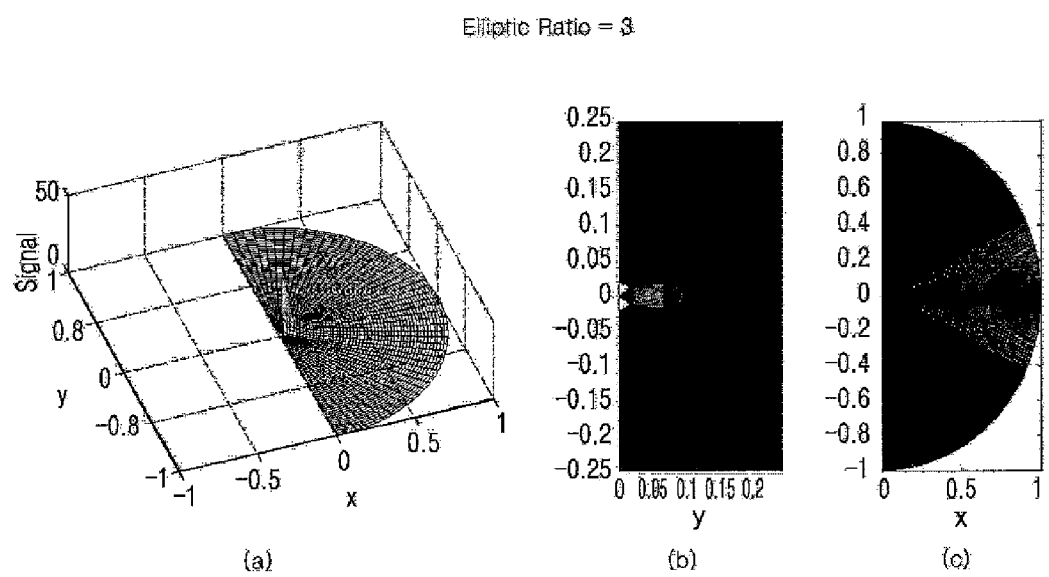

Referring to FIGS. 13 and 14, the probability functions use a combination of Equation 2 and Equation 5. That is, the probability is a function of both a distance and an azimuth, and also of an elliptic ratio, and is expressed as in Equation 10. The elliptic ratio is 2 in FIG. 11, and the elliptic ratio is 3 in FIG. 12.

$$F(r, \theta) = \frac{a}{r}\cos(Er \times \theta) \qquad \text{[Equation 10]}$$

where F is the probability function, Er is the elliptic ratio, $\theta$ is the azimuth, r is the distance, and a is a constant.

The probability function has a higher value closer to a target point, that is, as the distance r decreases. In addition, the probability function has a higher value as the azimuth approaches 0, that is, a reference line, and values of the probability functions increase in a region close to the reference line as the elliptic ratio increases. As shown in (c), the orientation-dependent weight increases as the azimuth approaches 0 and as the elliptic ratio increases.

As described above, by defining a probability function to include an orientation-dependent component, effects of features which are separated by the same distance but at different orientations with respect to a target location in a specific layout may be precisely analyzed. In particular, effects of a feature located perpendicular to a target point and a feature inclined with respect to the target point on the layout may be more realistically analyzed. Accordingly, the layout may be more accurately corrected, and thus a desired pattern may be formed with higher precision.

Figure 15:
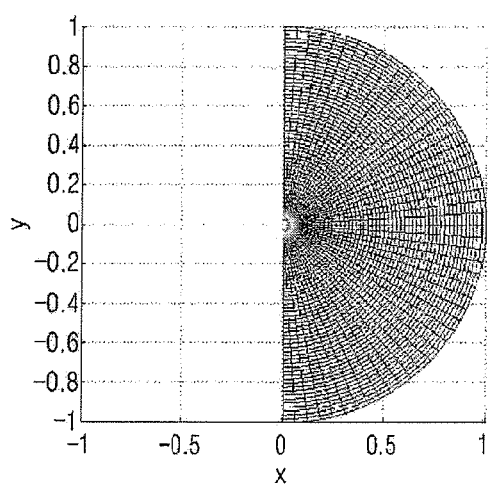
FIGS. 15 and 16 are graphs illustrating proximity ranges that vary according to elliptic ratios, according to embodiments of the inventive concept.
Figure 15:
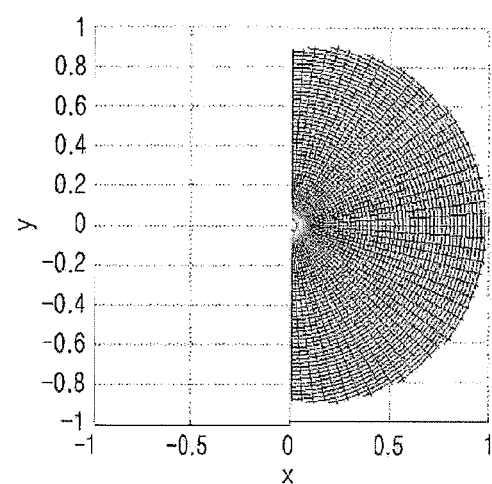
Figure 15:
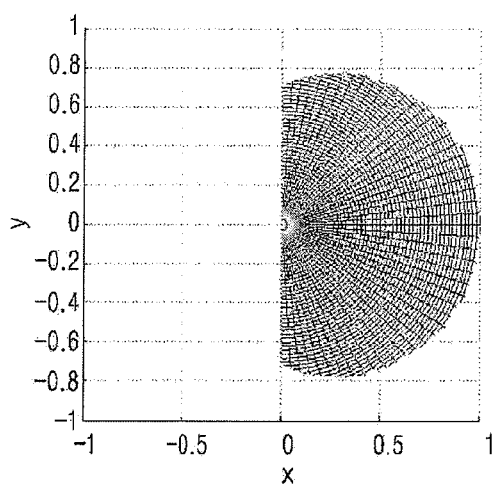
Figure 15:
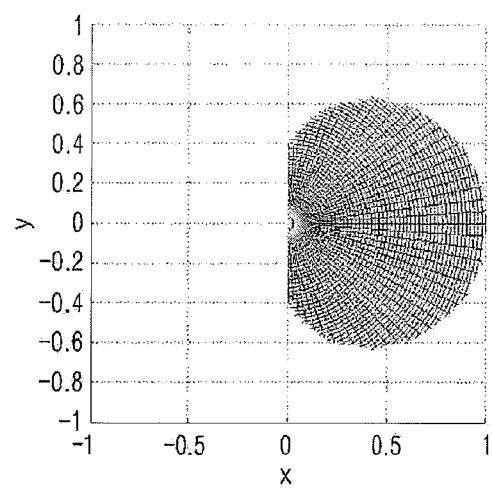
Figure 16:
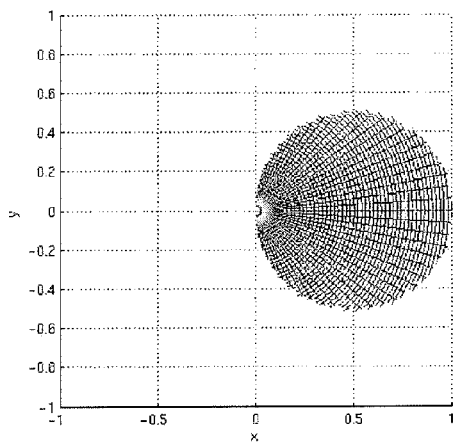
Figure 16:
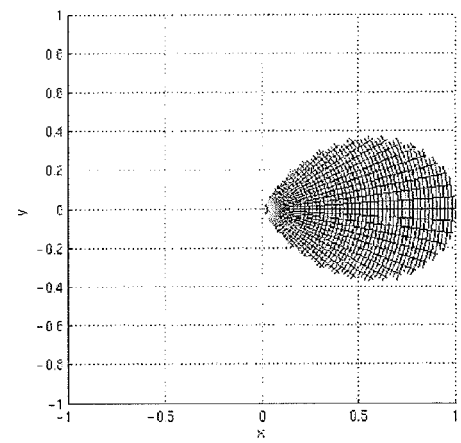
Figure 16:
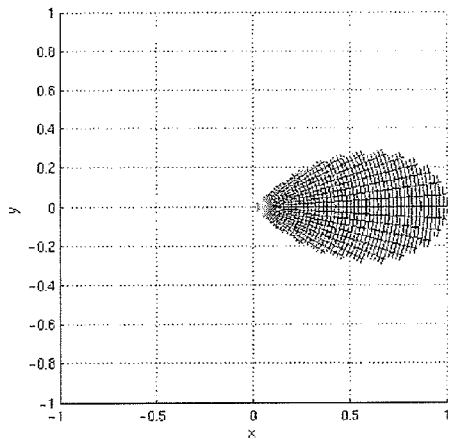
Figure 16:
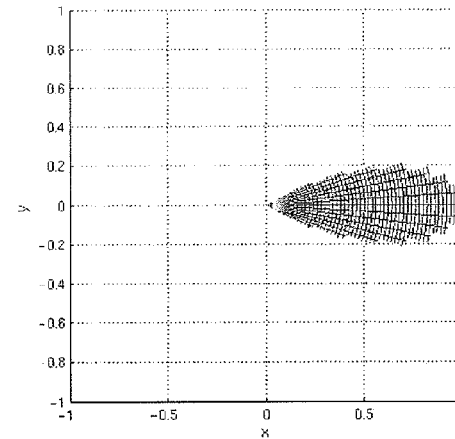

Alternatively, the proximity range may be defined to have an orientation dependent component, such as the elliptic ratio. FIGS. 15 and 16 are graphs illustrating proximity ranges for different elliptic ratios that vary according the azimuthal angle, according to embodiments of the inventive concept. In FIGS. 15 and 16, proximity ranges with respect to elliptic ratios of 0, 0.25, 0.5, 0.75, 1, 1.5, 2, and 3 are shown. An elliptical ratio of 0 is equivalent to a proximity range with no orientation dependence.

Referring to FIGS. 15 and 16, an area of the proximity range decreases as the elliptic ratio increases, and converges toward a reference line. A probability function is calculated within the proximity range, and is not calculated outside the proximity range. The elliptic ratio is only one example of an orientation-dependent component included in the proximity range, and the present embodiment is not limited thereto.

Accordingly, by defining a proximity range to include an orientation-dependent component, effects of features which are separated by the same distance but have different orientations in a specific layout may be precisely analyzed. In particular, effects of a feature that is located perpendicular to a target point and a feature that is inclined with respect to the target point on the layout may be more realistically analyzed. Accordingly, the layout may be more accurately corrected, and thus, a desired pattern may be formed with greater precision.

Figure 17:
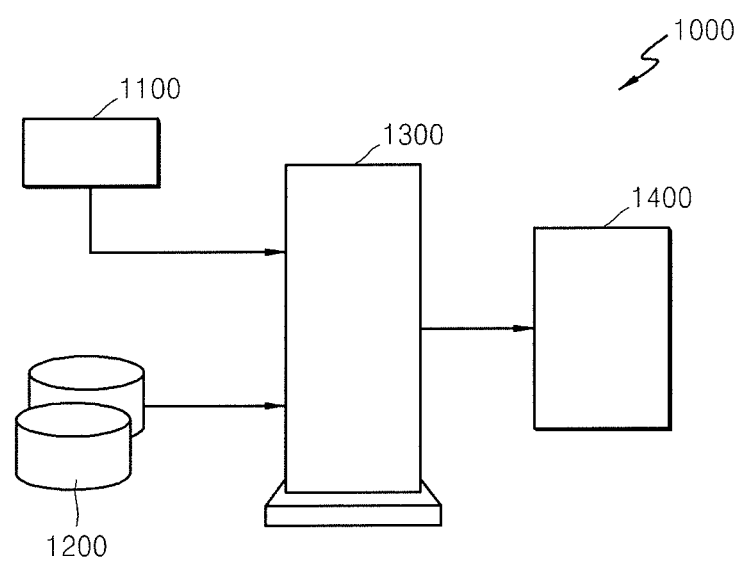
FIG. 17 is a diagram illustrating a system for executing a method of forming a layout of a photomask, according to an embodiment of the inventive concept.

FIG. 17 is a diagram illustrating a system 1000 for executing a method of forming a layout of a photomask, according to an embodiment of the inventive concept.

In detail, a computer system 1300 for executing the method of forming the layout of the photomask may be a computer or a workstation used for general purposes. The computer system 1300 may be a stand-alone computer or may be connected in a network. The computer system 1300 may include a single processor or a multiprocessor for executing operations. The computer system 1300 may be a parallel-processing computer system.

The computer system 1300 executes a sequence of executable instructions which are recorded on a program storage medium 1100, for example, a hard disk, a compact disc (CD), or a digital video disc (DVD), or are transmitted through a wired/wireless communication network such as the Internet. The computer system 1300 receives a file containing information about a layout from a layout file storage 1200, for example, a database or another storage medium, and executes instructions for reading the file.

The computer system 1300 performs OPC on a layout, corrects the layout by using OPC, and then forms a file containing processing information. Next, the computer system 1300 determines whether a desired target layout has been formed by performing comparison and verification, and, if verified, transmits the target layout to a mask recording device 1400 to manufacture a photomask or a reticle.

The system 1000 may include an input mechanism for receiving a layout of a mask pattern, a mechanism for obtaining image parameters of a 2D layout mask from a simulation, a mechanism for obtaining image parameters of a 3D layout mask from a simulation, a mechanism for obtaining differences between the image parameters of the 2D and 3D masks, and a mechanism for performing OPC on the 2D mask by compensating for the differences between the image parameters by using a visible kernel with respect to the 2D mask.

Also, the system 1000 may include a selecting mechanism for selecting a target point on an edge of the layout, a setting mechanism for setting a proximity range from the target point, a defining mechanism for defining a probability function including either a distance-dependent component, an orientation-dependent component, or a combination of both with respect to the proximity range, and a calculating mechanism for calculating a surface integral of the probability function over the proximity range.

Embodiments of the inventive concept may be embodied as computer-readable codes in a computer-readable recording medium. The computer-readable recording medium may be any recordable apparatus capable of storing data that is read by a computer system.

Examples of a computer-readable recording medium include read-only memories (ROMs), random-access memories (RAMs), CD-ROMs, magnetic tapes, floppy disks, and optical data storage devices. The computer readable medium may be distributed among computer systems that are interconnected through a network, and embodiments of the inventive concept may be stored and implemented as computer readable codes in the distributed system.

Here, a program or code stored in the storage medium is a series of instructions directly or indirectly used by a device having information processing ability, such as a computer, to obtain a specific result.

Accordingly, the term "computer" may refer to any device having an information processing ability to perform a specific function, examples of such a device including, but not being limited to, a calculation device or a mobile telecommunication device.

The storage medium may store programmed instructions for executing on a computer a method including receiving a layout of a mask pattern, obtaining image parameters of a 2D layout mask from a simulation, obtaining image parameters of a 3D layout mask from a simulation, obtaining differences between the image parameters of the 2D and 3D masks, and performing OPC for the 2D mask by compensating for the difference between the image parameters by using a visible kernel with respect to the 2D mask.

Also, the storage medium may store programmed instructions for executing on a computer a method including selecting a target point on an edge of the layout, setting a proximity range from the target point, defining a probability function including either a distance-dependent component, an orientation-dependent component, or a combination of both a distance-dependent component and an orientation-dependent component with respect to the proximity range, and calculating a surface integral of the probability function over the proximity range.

As described above, according to embodiments of the inventive concept, a method of forming the layout of the photomask performs OPC for compensating a 3D mask effect. Accordingly, the layout of a photomask may be easily formed without increasing a simulation time.

While embodiments of the inventive concept has been particularly shown and described with reference to exemplary embodiments thereof, it will be understood that various changes in form and details may be made therein without departing from the spirit and scope of the following claims.

What is claimed is:

1. A method of correcting a photomask layout to compensate for a three-dimensional (3D) mask effect, the method comprising:

receiving by a computer a layout of a mask pattern;

obtaining one or more image parameters of a two-dimensional (2D) mask for the layout from a computer simulation;

obtaining one or more image parameters of a 3D mask for the layout from a computer simulation;

obtaining differences between the one or more image parameters of the 2D and 3D masks;

compensating for the differences between the one or more image parameters of the 2D and 3D masks by convolving a probability function with respect to an open area, represented by a visible kernel function, $\Psi_{op}$, with a mask function M(x,y), to produce a first function, convolving a probability function with respect to a blocked area, represented by a visible kernel function, $\Psi_{bl}$, with the mask function M(x,y) to produce a second function, and summing the first function and the second function to produce a compensated vector $\overrightarrow{\text{Comp}}$, as expressed by $$\overrightarrow{\text{Comp}} = C_{op} \cdot \Psi_{op}(x,y) \otimes M(x,y) + C_{bl} \cdot \Psi_{bl}(x,y) \otimes M(x,y) + C_0,$$

wherein $C_{op}$, $C_{bl}$, and $C_0$ are constants determined to minimize an error between the compensated vector $\overrightarrow{\text{Comp}}$ and differences $\overrightarrow{\text{diff}}$ between the image parameters of the 2D and the image parameters of the 3D masks; and correcting the photomask layout by modeling optical proximity correction (OPC) with the compensated vector $\overrightarrow{\text{Comp}}$.

2. The method of claim 1, wherein compensating for the differences between the image parameters comprises:
selecting a target point on an edge of the layout;
setting a proximity range from the target point; and
defining the probability function including one or more of a distance-dependent component and an orientation-dependent component with respect to the proximity range.

3. The method of claim 2, wherein the distance-dependent component decreases with increasing distance from the target point.

4. The method of claim 3, wherein the distance-dependent component is proportional to a reciprocal of the distance, as expressed by $$f(r) = \frac{a}{r},$$

wherein f is the distance-dependent component, r is the distance, and a is a constant.

5. The method of claim 3, wherein the distance-dependent component comprises a Gaussian function with respect to the distance, expressed as $$G(r) = ae^{-\left(\frac{r}{b}\right)^2},$$

wherein G(r) is the Gaussian function, r is the distance, and a and b are constants.

6. The method of claim 2, wherein the orientation-dependent component varies depending on an azimuth from a reference line passing through the target point.

7. The method of claim 6, wherein the reference line extends in a direction perpendicular to the edge.

8. The method of claim 6, wherein the orientation-dependent component decreases as the azimuth increases.

9. The method of claim 6, wherein the orientation-dependent component is a function of an elliptic ratio.

10. The method of claim 6, wherein the orientation-dependent component is proportional to a cosine of the azimuth.

11. The method of claim 10, wherein the cosine of the azimuth is a function of an elliptic ratio, expressed as $$f(\theta) = a\cos(Er \times \theta)$$

wherein f is the orientation-dependent component, Er is the elliptic ratio, $\theta$ is the azimuth, and a is a constant.

12. The method of claim 6, wherein the orientation-dependent component comprises a Gaussian function with respect to the azimuth, expressed as $$G(\theta) = ae^{-\left(\frac{\theta}{b}\right)^2},$$

wherein G($\theta$) is the Gaussian function, $\theta$ is the azimuth, and a and b are constants.

13. The method of claim 12, wherein the Gaussian function includes an elliptic ratio, expressed as $$G(\theta) = ae^{-\left(\frac{Er \times \theta}{b}\right)^2},$$

wherein G($\theta$) is the Gaussian function, Er is the elliptic ratio, $\theta$ is the azimuth, and a and b are constants.

14. The method of claim 2, wherein the proximity range comprises an orientation-dependent component.

15. The method of claim 14, wherein the orientation-dependent component of the proximity range varies according to an elliptic ratio.

16. The method of claim 2, wherein selecting the target point comprises selecting a middle point of the edge as the target point.

17. A method of correcting a photomask layout to compensate for a three-dimensional (3D) mask effect, the method comprising:
receiving by a computer a layout of a mask pattern;
obtaining one or more image parameters of a two-dimensional (2D) mask for the layout from a computer simulation;
obtaining one or more image parameters of a 3D mask for the layout from a computer simulation;
obtaining differences between the one or more image parameters of the 2D and 3D masks; and
compensating for differences between image parameters of the 2D mask for the layout mask pattern and the 3D mask for the layout mask pattern, including:
selecting a target point on an edge of the layout;
setting a proximity range from the target point;
defining a probability function including one or more of a distance-dependent component and an orientation-dependent component with respect to the proximity range;
calculating a surface integral of the probability function over the proximity range to obtain a compensated vector $\overrightarrow{\text{Comp}}$, wherein said surface integral is used to model optical proximity correction associated with positions of visible features in the layout with respect to the target point, and
correcting the photomask layout by modeling optical proximity correction (OPC) with the compensated vector $\overrightarrow{\text{Comp}}$.

18. The method of claim 17, wherein calculating a surface integral of the probability function over the proximity range comprises convolving a probability function with respect to an open area, represented by a visible kernel function, $\Psi_{op}$, with a mask function M(x,y), and convolving a probability function with respect to a blocked area, represented by a visible kernel function, $\Psi_{bl}$ with the mask function M(x,y) to produce a second function, and further comprising summing the first function and the second function to obtain compensated vector $\overrightarrow{\text{Comp}}$, as expressed by $$\overrightarrow{\text{Comp}} = C_{op} \cdot \Psi_{op}(x,y) \otimes M(x,y) + C_{bl} \cdot \Psi_{bl}(x,y) \otimes M(x,y) + C_0,$$

wherein $C_{op}$, $C_{bl}$ and $C_0$ are constants determined to minimize an error between the compensated vector $\overrightarrow{\text{Comp}}$ and the differences $\overrightarrow{\text{diff}}$ between the image parameters of the 2D and the image parameters of the 3D masks, wherein said compensated vector $\overrightarrow{\text{Comp}}$ compensates said differences.

* * * * *